United States Patent
Comeau et al.

(10) Patent No.: US 10,615,132 B2
(45) Date of Patent: Apr. 7, 2020

(54) INTEGRATED CIRCUIT CAPABLE OF OPERATING AT VERY HIGH VOLTAGE AND METHOD OF FABRICATING SAME

(71) Applicants: Alain Comeau, Escondido, CA (US); Stephen Swift, San Diego, CA (US)

(72) Inventors: Alain Comeau, Escondido, CA (US); Stephen Swift, San Diego, CA (US)

( * ) Notice: Subject to any disclaimer, the term of this patent is extended or adjusted under 35 U.S.C. 154(b) by 125 days.

(21) Appl. No.: 15/921,775

(22) Filed: Mar. 15, 2018

(65) Prior Publication Data
US 2018/0286821 A1    Oct. 4, 2018

Related U.S. Application Data

(60) Provisional application No. 62/478,026, filed on Mar. 28, 2017.

(51) Int. Cl.
| | |
|---|---|
| *H01L 23/64* | (2006.01) |
| *H01L 49/02* | (2006.01) |
| *H01L 21/84* | (2006.01) |
| *H01L 27/12* | (2006.01) |
| *H01L 21/762* | (2006.01) |

(52) U.S. Cl.
CPC ...... *H01L 23/647* (2013.01); *H01L 21/76264* (2013.01); *H01L 21/84* (2013.01); *H01L 27/1203* (2013.01); *H01L 28/20* (2013.01); *H01L 21/76275* (2013.01); *H01L 21/76283* (2013.01)

(58) Field of Classification Search
CPC .. G05F 3/00; G05F 3/205; G11C 5/00; G11C 5/145; H01L 21/00; H01L 21/76264; H01L 21/76275; H01L 21/76283; H01L 21/84; H01L 23/00; H01L 23/647; H01L 27/00; H01L 27/1203; H01L 28/00; H01L 28/20; H02M 2003/00; H02M 2003/077; H02M 3/00; H02M 3/07; H02M 3/073
USPC ........................................................ 327/536
See application file for complete search history.

(56) References Cited

U.S. PATENT DOCUMENTS

| | | | |
|---|---|---|---|
| 4,766,366 A * | 8/1988 | Davis ................... | G05F 3/18 257/536 |
| 2013/0214869 A1* | 8/2013 | Matsuzaki ............ | G05F 1/567 331/70 |

* cited by examiner

*Primary Examiner* — Lincoln D Donovan
*Assistant Examiner* — Dave Mattison

(57) ABSTRACT

An integrated circuit (IC) fabricated on a Silicon-On-Insulator (SOI) wafer, having a plurality of impedance elements cascoded in series, each impedance element having a specified value. A subset of the impedance elements are arranged to bias a first tub at a specified very high voltage (VHV) multiplied by a first predetermined ratio. A further subset of the impedance elements are arranged to bias a second tub at VHV multiplied by a second predetermined ratio and each of the impedance elements are further arranged to bias a handle and a third surrounding tub at VHV multiplied by a third predetermined ratio. A method for designing an integrated circuit using fully dielectrically isolated processes which function reliably at higher operating voltages than that provided by the conventional processes.

20 Claims, 10 Drawing Sheets

INTEGRATED CIRCUIT CAPABLE OF OPERATING AT VERY HIGH VOLTAGE AND METHOD OF FABRICATING SAME

CROSS REFERENCE TO RELATED APPLICATION

This application claims priority to U.S. Provisional Patent Application Ser. No. 62/478,026, filed Mar. 28, 2017 entitled: INTEGRATED CIRCUIT CAPABLE OF OPERATING AT VERY HIGH VOLTAGE AND METHOD OF FABRICATING SAME, the contents of which are incorporated herein by reference.

TECHNICAL FIELD

The present invention relates to integrated circuits (ICs) capable of operating reliably at very high voltages and methods of fabricating same.

BACKGROUND OF THE INVENTION

There are a variety of different IC manufacturing processes, including complementary metal oxide semiconductor (CMOS), Bipolar, and Bipolar CMOS (BiCMOS). Every IC has specified operating and environmental conditions, including maximum operating voltages, to ensure reliability. Processes and techniques used when fabricating ICs to ensure reliability include the use of dielectric isolation such as dielectric trenches and buried oxide (BOX) operable to isolate components from one another.

Dielectric isolation is a well-known technique for fabricating high voltage devices in integrated circuits. The technique involves growing a silicon dioxide insulating layer on a handle wafer, then bonding a silicon wafer onto the oxide layer to form a Silicon-On-Insulator (SOI) wafer structure. The handle is a silicon substrate over which the buried oxide (BOX) and thinner top silicon layer are deposited. The technique further involves etching trenches in the silicon substrate down to the buried oxide (BOX) layer, the trenches thus separating islands of silicon referred to as tubs. The trenches are then further oxidized and backfilled. The tubs are thus electrically isolated from each other by the insulating trenches and BOX layer. Regardless of the process used, a maximum operating voltage is typically specified for an IC component.

No products or methods exist for increasing maximum IC component operating voltages other than designing components capable of operating at higher voltages. Typically, a series connection is used for component level design when higher voltages are required. What is desired is an integrated circuit including therein at least one component operable to withstand very high voltages.

In one simple example, a simple resistor divider capable of dividing voltages above 1000V may be required. Referring to circuit 100 of FIG. 1, if the very high voltage (VHV) is 1000 volts then VHV/100 is approximately 10 volts. In the circuit 100 of FIG. 1, the challenge is designing and fabricating the 30 MegOhm resistor 101 such that it withstands voltages greater than 1000 volts. Using the components seen in circuit 100 of FIG. 1, the fabrication process only allows for 320 volt maximum potential between resistor (polysilicon) electrodes and tub and 650 volts between tubs and 700 volts between tubs and handle.

SUMMARY OF THE INVENTION

The present invention comprises an IC having components capable of operating reliably at very high voltages. The method for designing ICs of the present invention uses a Silicon-On-Insulator (SOI) wafer, novel bias scheme, series architecture (cascode) and novel tub biasing. An embodiment of the invention can be implemented using a 1.0 micrometer (um) CMOS process (maximum operating voltages are 625 volts for NMOS and 560 volts for PMOS) to fabricate ICs operating reliably at 1,000 or higher volts. The invention allows for the fabrication of ICs using fully dielectrically isolated components which function reliably at operating voltages significantly higher than operating voltages fabricated using conventional processes, while maintaining these components within maximum operating voltage limits.

To those skilled in the art to which this invention relates, many changes in construction and widely differing embodiments and applications of the invention will suggest themselves without departing from the scope of the invention as defined herein. The disclosures and the descriptions herein are purely illustrative and are not intended to be in any sense limiting.

BRIEF DESCRIPTION OF THE DRAWINGS

For a better understanding of the present invention including the features, advantages and embodiments, reference is made to the following detailed description along with accompanying Figures wherein.

DETAILED DESCRIPTION OF A PREFERRED EMBODIMENT

While the making and using of the disclosed embodiments of the invention is discussed in detail below, it should be appreciated that the present invention provides many applicable inventive concepts which can be embodied in a wide variety of contexts. Some features of the preferred embodiments shown and discussed may be simplified or exaggerated for illustrating the principles of the invention.

The present invention comprises an IC having components capable of operating reliably at very high voltages. The designs used to illustrate the present invention use a Silicon-On-Insulator (SOI) wafer, novel bias scheme, series architecture and novel tub biasing. The invention can be implemented using a 1.0 um CMOS process (maximum operating voltages are 625 volts for NMOS and 560 volts for PMOS) to design and fabricate ICs operating reliably at more than 1,000 volts. The invention implements fully dielectrically isolated components which function reliably at operating voltages significantly higher than that provided by conventional processes while maintaining these internal components within maximum operating voltage limits. The component level design of the invention couples the components, elements or devices in series inside the dielectric isolated manufacturing process. The invention as disclosed herein uses resistors as impedance dividers to create "handle" voltages. One skilled in the art would recognize that any impedance element or device, such as a resistor, capacitor or inductor, alone, or in combination, can be used depending on the implementation. For example, the parasitic properties of capacitors and inductors can be used to create the handle voltage in short-duration transient pulse applications.

Figure 1:
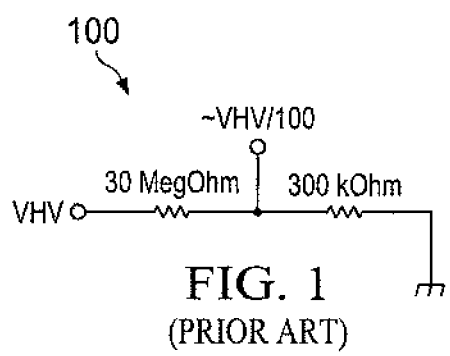
FIG. 1 illustrates first a conventional high voltage circuit.
Figure 2:
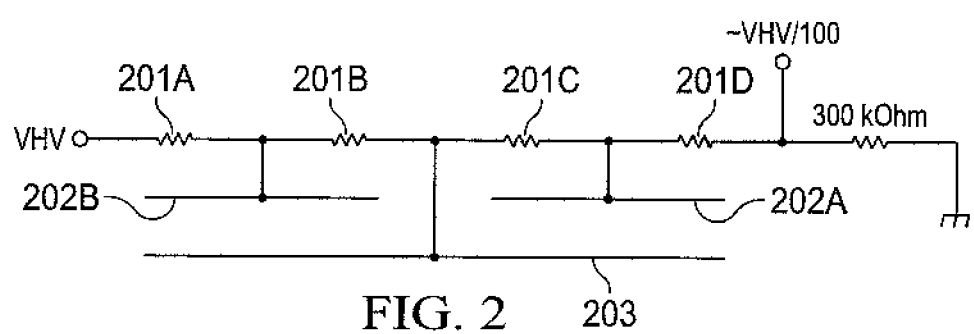
FIG. 2 is a first embodiment of a circuit diagram of the invention.

An example embodiment of the invention 200 as seen in FIG. 2 uses four (4) impedance elements, here resistors 201A, 201B, 201C and 201D, each having a value of 7.5 MegOhm (each rated at 320 volts maximum). As seen therein, the resistors 201A, 202B, 201C and 201D are coupled in series. These resistors are used to bias tub 202B at a very high voltage (VHV) multiplied by ¾ and bias tub 202A at VHV multiplied by ¼. The handle 203 and surrounding tubs are biased using the resistors at VHV multiplied by ½. As seen therein, two (2) resistors are used per tub for biasing, one at +320 volts maximum to tub and one at −320 volts maximum to tub.

More specifically, the IC embodiment of the present invention comprises four (4) series resistors, each resistor having a value of 7.5 MegOhm, such four series resistors biasing a first tub at VHV multiplied by ¼ and biasing a second tub at VHV multiplied by ¾. The handle and surrounding tub are biased using the resistors at VHV multiplied by ½. In an embodiment, each of the four (4) series resistors are rated to have a potential across the terminals thereof of 320 volts and two (2) resistors are used per tub for biasing, one at +320 volts maximum to tub and one at −320 volts maximum to tub. This embodiment of this invention operates reliably up to 320 volts multiplied by 4, or 1,280 volts, and at 1,000 volts, offers 250 volts maximum across the resistors to tub. It also cancels the first order voltage coefficient between the resistors and tub.

Figure 3:
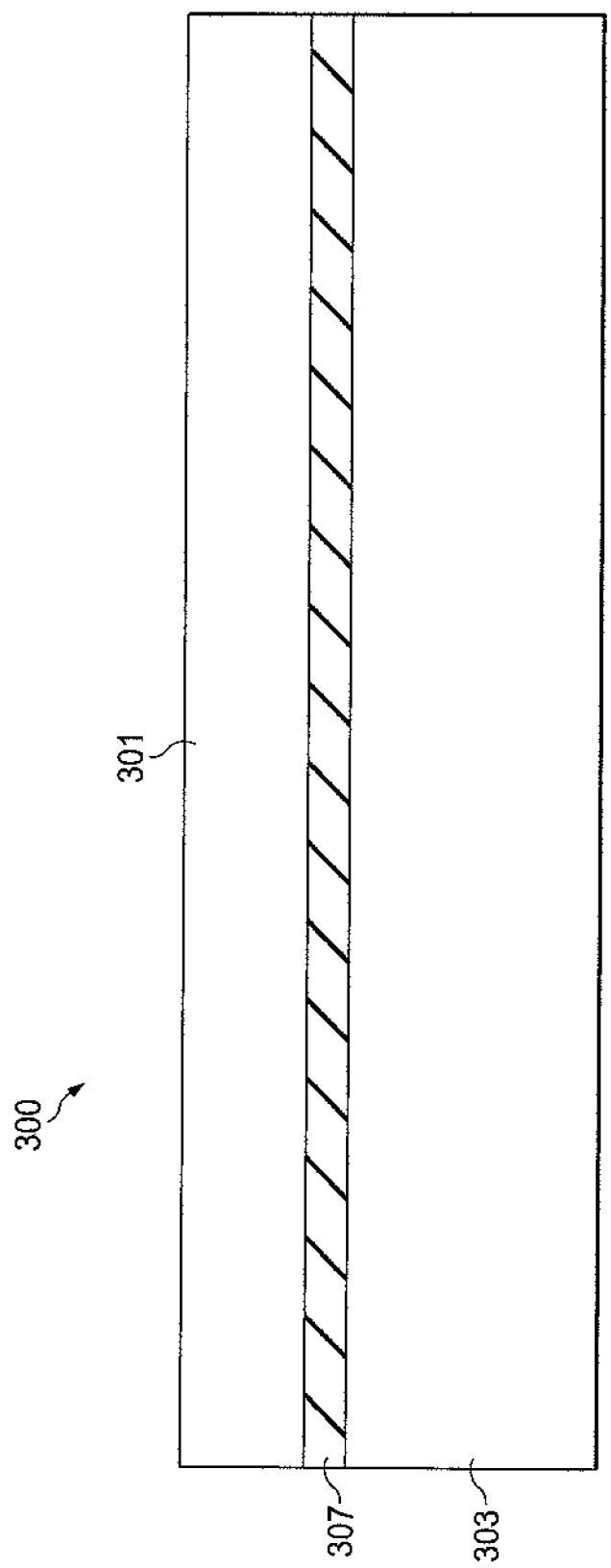
FIG. 3 is an illustration of an early step in fabricating an IC of the invention.
Figure 4:
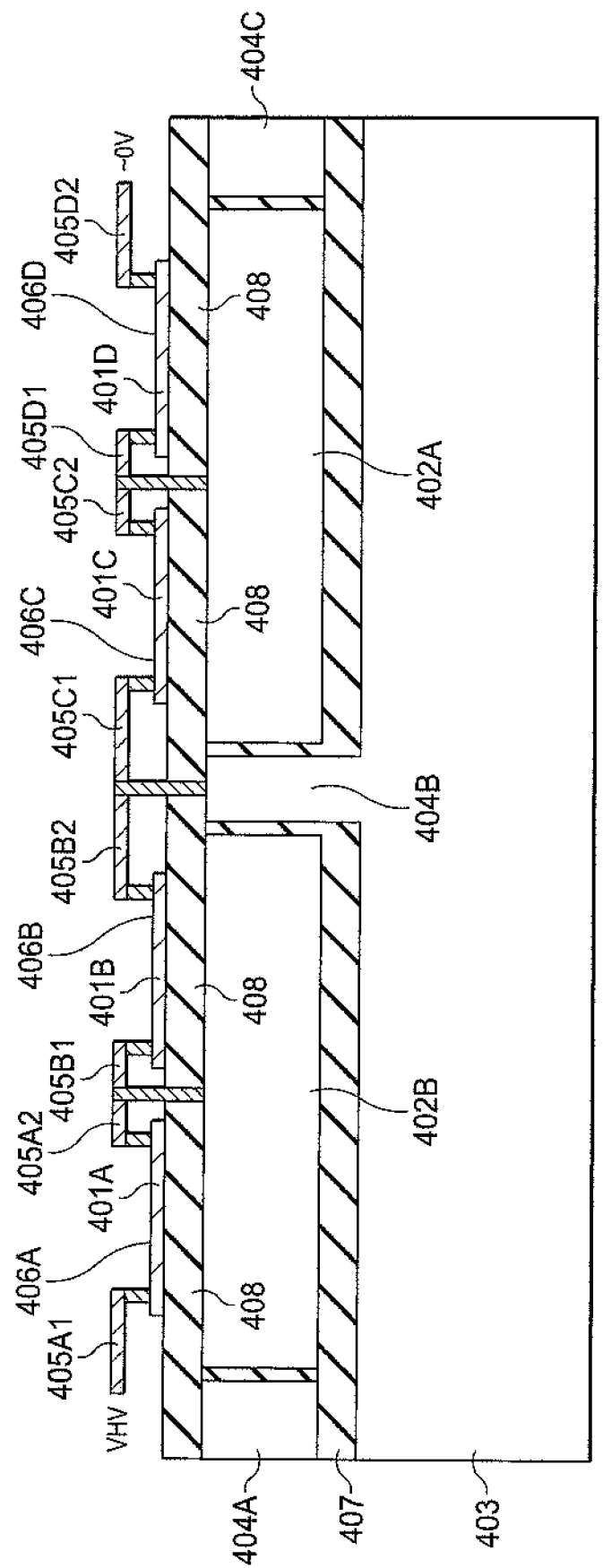
FIG. 4 is an illustration of a later step in fabricating an IC of the invention.

FIG. 3 illustrates the Silicon-On-Insulator (SOI) wafer starting material 300 for fabricating the invention as seen in FIG. 4. As seen in FIG. 3, SOI wafers are a three-layer material stack composed of the following: active layer of silicon (device layer) 301 over a buried oxide layer (BOX) 307 of electrically insulating silicon dioxide, over a bulk silicon support wafer or handle 303.

FIG. 4 generally corresponds to FIG. 2 wherein impedance elements comprising four (4) 7.5 MegOhm resistors 401A, 401B, 401C and 401D are coupled in series. These resistors are used to bias tub 402B at a very high voltage (VHV) multiplied by ¾ and bias tub 402A at VHV multiplied by ¼. The handle 403 and 404B are biased using the resistors at VHV multiplied by ½. Resistor 401A has a first conductive terminal 405A1 and a second conductive terminal 405A2 made of a metal. Resistor 401B has a first conductive terminal 405B1 and a second conductive terminal 405B2 made of a metal. Resistor 401C has a first conductive terminal 405C1 and a second conductive terminal 405C2 made of a metal. Resistor 401D has a first conductive terminal 405D1 and a second conductive terminal 405D2 made of a metal. The polysilicon layer is seen as 406A, 406B, 406C, 406D. The first conductive terminal 405A1 of resistor 401A and the second conductive terminal 405D2 of resistor 401D are coupled across a very high voltage (VHV) potential. Terminal 405A2 of resistor 401A and terminal 405B1 of resistor 401B are coupled via a metal conductor to a first tub, tub 402B. The voltage at tub 402B with reference to 0 volts is VHV multiplied by ¾. Terminal 405B2 of resistor 401B and terminal 405C1 of resistor 405C are coupled via a metal conductor to handle contact 404B. The tub 403 and 404B, with reference to 0 volts is VHV multiplied by ½ and is separated from tub 401A and tub 402B by a BOX layer 407. The handle 403 is below the BOX layer 407 and is at approximately VHV multiplied by ½. Terminal 405C2 of resistor 401C and terminal 405D1 of resistor 401D are coupled via a metal conductor to a second tub, tub 401A. The voltage at tub 401A with reference to 0 volts is VHV multiplied by ¼.

The invention thus comprises an integrated circuit (IC) fabricated on a Silicon-On-Insulator (SOI) wafer, comprising four (4) cascoded impedance elements arranged connected in series, each impedance elements having a specified value. Each of the impedance elements is arranged to bias a first tub at a specified very high voltage (VHV) multiplied by a first predetermined ratio, each of the impedance elements further arranged to bias a second tub at VHV multiplied by a second predetermined ratio, and each of the impedance elements further arranged to bias the handle and a third surrounding tub at VHV multiplied by a third predetermined ratio. Each impedance element is one selected from any combination of resistors, capacitors and inductors. Where each impedance element is a resistor, each of the four (4) cascoded resistors have substantially the same resistance value. In a further aspect, Each of the four (4) cascoded series resistors have different resistance values. Any of the first tub, second tub or surrounding third tub can be situated inside a fourth tub. Each of the first tub and second tub can be situated inside a respective fourth tub and fifth tub.

More generally, the invention is an integrated circuit (IC) fabricated on a Silicon-On-Insulator (SOI) wafer, having a plurality of impedance elements cascoded in series, each impedance element having a specified value. A subset of the impedance elements are arranged to bias a first tub at a specified very high voltage (VHV) multiplied by a first predetermined ratio. A further subset of the impedance elements are arranged to bias a second tub at VHV multiplied by a second predetermined ratio and each of the impedance elements are further arranged to bias a handle and a third surrounding tub at VHV multiplied by a third predetermined ratio.

An embodiment of the invention is an integrated circuit, comprising four (4) resistors arranged in series, each resistor having a value of 7.5 MegOhms; a first terminal of the first resistor configured to be coupled to a VHV and a second terminal of the first resistor coupled to a first terminal of the second resistor; the second terminal of the first resistor and the first terminal of the second resistor coupled to a first tub at a specified very high voltage (VHV) multiplied by ¾; the second terminal of the third resistor and the first terminal of the fourth resistor coupled to a second tub at a specified very high voltage (VHV) multiplied by ¼; and the second terminal of the second resistor and the first terminal of the third resistor coupled to bias a handle and surrounding tub at approximately VHV multiplied by ½.

In such general arrangement, each of the four (4) series resistors is rated to have a maximum potential across the terminals thereof of 320 Volts. Further, each of the resistors and SOI wafer characteristics are operable to bias one tub at +320 volt maximum and the other tub at −320 volt maximum. Even more generally, the invention is an IC fabricated on an SOI wafer, comprising four (4) resistors arranged in series, each resistor having a specified value, each of the resistors arranged to bias a first tub at a specified very high voltage (VHV) multiplied by a first predetermined ratio, each of the resistors further arranged to bias a second tub at VHV multiplied by a second predetermined ratio; and each of the resistors further arranged to bias the handle and surrounding tub at VHV multiplied by a third predetermined ratio. In an embodiment, each of the four (4) series resistors has substantially the same resistance. In a further embodiment, each of the four (4) series resistors has different resistance values.

The invention facilitates the fabrication of higher voltage ICs without creating higher voltage components. The invention is scalable and can turn a 50 volt design into a 100 volt design or 150 volt design (e.g., N multiplied by 50 volts). The maximum voltage is limited to approximately twice the buried oxide (BOX) breakdown voltage.

Figure 5:
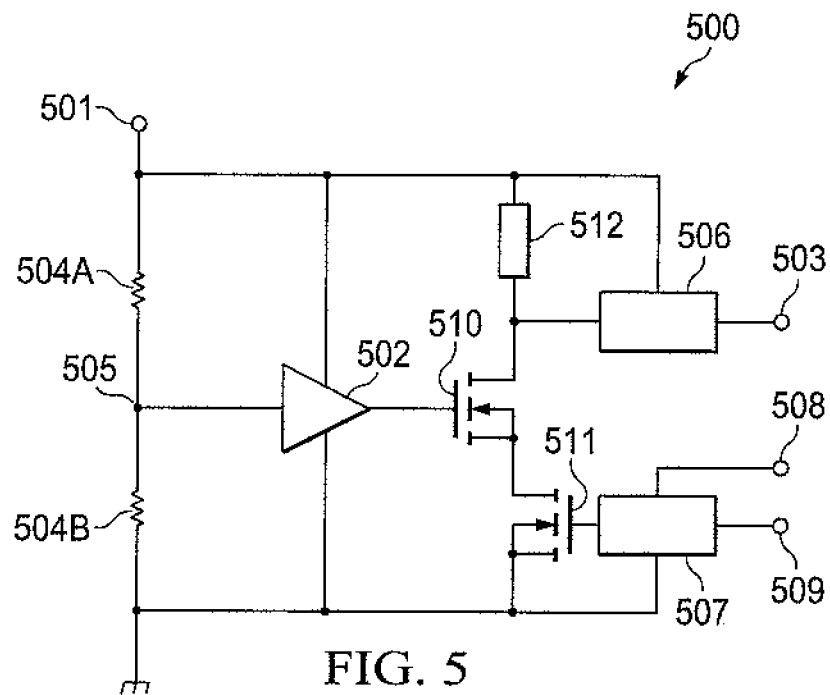
FIG. 5 is a diagram of a circuit that incorporates the invention.
Figure 6:
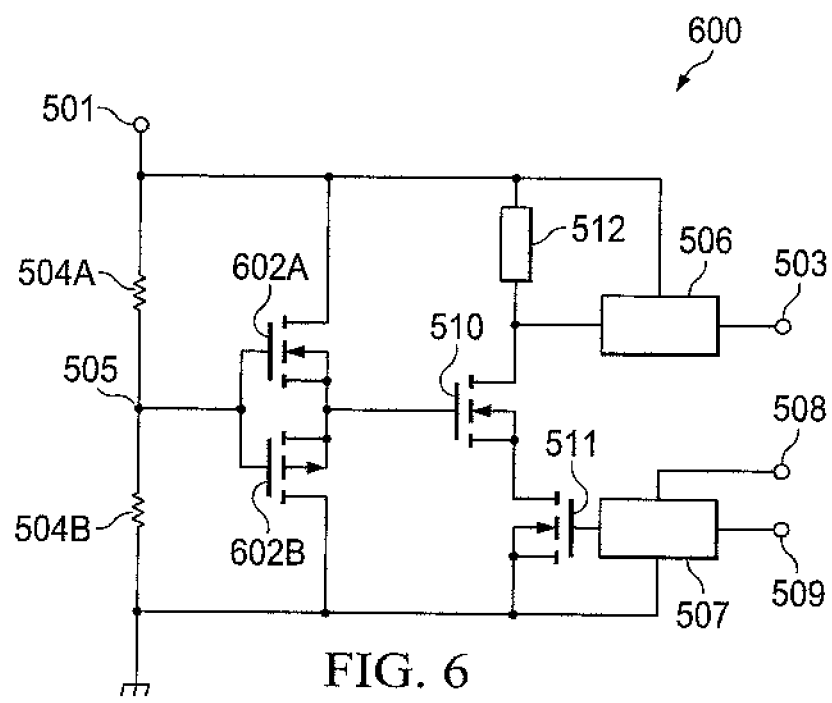
FIG. 6 is a further embodiment of a circuit diagram of the invention.

An implementation of the invention is seen in FIGS. 5 and 6. As seen in circuit 500 of FIG. 5, there is a desired characteristic of the circuit to provide an output at terminal 503 of VHV minus 30 Volts from −30V pump 506 wherein VHV at terminal 501 is greater than 1 kV. A voltage divider comprised of resistors 504A and 504B provide a voltage of VHV multiplied by ½ at the junction 505 of buffer 502. In an embodiment, resistors 504A and 504B are each comprised of 30 MegOhm resistors. Oscillator 507 provides a Vcc output at terminal 508, enable I/O is provided at terminal 509. NMOS transistors 510 and 511 are cascoded, the gate of NMOS transistor 510 being coupled to output of the buffer 502 and the gate of NMOS transistor 511 is coupled to the input of oscillator 507. Circuit element 512 is a circuit load.

Circuit 600 of FIG. 6 is equivalent to circuit 500 of FIG. 5, however, FIG. 600 shows further granularity of buffer 502, comprised of a complementary NMOS transistor 602A and PMOS transistor 602B. As seen in circuit 600 of FIG. 6, there is a desired characteristic of the circuit of using complementary NMOS transistor 602A and PMOS transistor 602B to provide an output at terminal 503 of VHV minus 30 Volts from −30V pump 506 wherein VHV at terminal 501 is greater than 1 kV. A voltage divider comprised of resistors 504A and 504B provide a voltage of VHV multiplied by ½ at the terminal 505 of buffer 503. In an embodiment, resistors 504A and 504B are each comprised of 30 MegOhm resistors. Oscillator 507 provides a Vcc output at terminal 508, enable I/O is provided at terminal 509. NMOS transistors 510 and 511 are cascoded, the gate of NMOS transistor 510 being coupled to output of the buffer 502 and the gate of NMOS transistor 511 is coupled to the input of oscillator 507. Circuit element 512 is a circuit load. Buffer 502 is further seen in FIG. 6 as complementary NMOS transistor 602A and PMOS transistor 602B. The gates of each of NMOS transistor 602A and PMOS transistor 602B are coupled at junction 505. The drain of NMOS transistor 602A is at VHV and the drain of PMOS transistor 602B is at ground. The source of NMOS transistor 602A and the source of PMOS transistor 602B are coupled.

Figure 7:
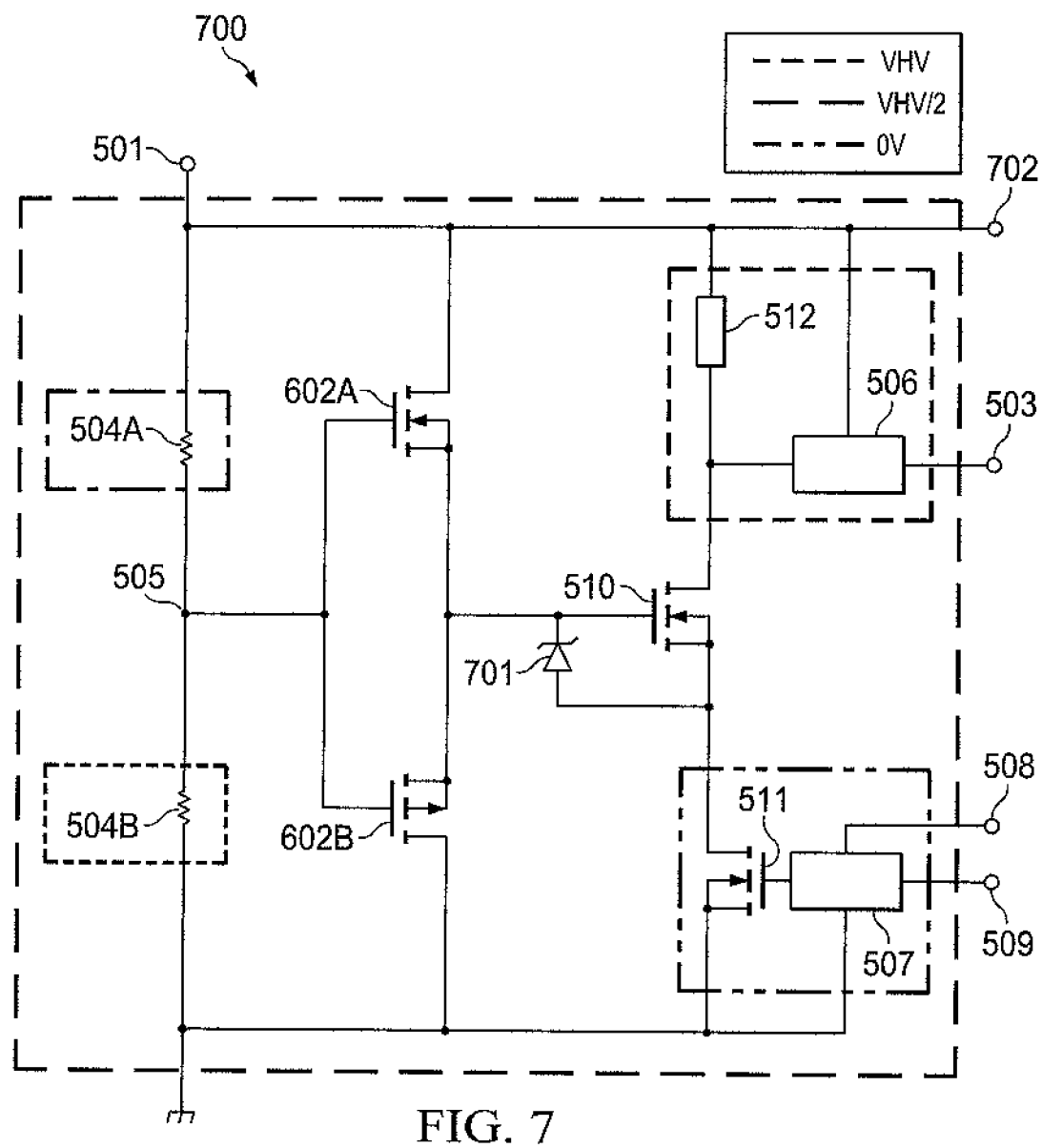
FIG. 7 is a further embodiment of a circuit diagram of the invention.

FIG. 7 is a further embodiment of the invention including components seen in FIGS. 5 and 6. As seen therein, the circuit 700 of FIG. 7 is hatched to reflect the tub voltages on the IC topology at the different places at 0V, VHV/2 and VHV. Circuit 700 illustrates the center-tap (VHV/2) provided by resistors 504A and 504B to cascoded NMOS transistors 602A and 602B with protection provided by Zener diode 701. In an embodiment, the 30 MegOhm resistor divider 504A and 504B are constructed in accordance with FIG. 2, with tub 202A at VHV multiplied by ¼ and tub 202B at VHV multiplied by ¾. Resistor 504A and 504B are both constructed according to FIG. 2 and FIG. 4, whereby each resistor is a series connection of two resistors of half the required value. For example, resistor 504A corresponds to elements 201A and 201B of FIG. 2 and resistor 504B corresponds to elements 201C and 201D of FIG. 2. Resistor 504A further corresponds to elements 405A1, 406A, 401A, 405A2, 405B1, 401B, 406B and 405B2 of FIG. 4. Resistor 504B further corresponds to elements 504C1, 406C, 401C, 405C2, 405D1, 401D, 406D and 405D2 of FIG. 4. Referring to 504A, the midpoint of the series connection of the two resistors comprising 504A biases the tub under the two resistors to half the voltage between the terminals of 504A. This connection ensures that the voltage between any point on the resistor 504A and the tub over which the resistors are constructed is limited to half the voltage difference between the terminals of resistor 504A. The same general description applies to resistor 504B.

Referring back to FIG. 7, the two resistors 504A and 504B provide a mid-high-voltage point (VHV/2) which is buffered by NMOS transistor 602A and PMOS transistor 602B. This buffered voltage is used to bias NMOS transistor 510. The tub and handle silicon are underneath these components. To operate the pump 506, NMOS transistor 510 relays current from NMOS transistor 507 into current element 512 which generates alternating potential for the voltage pump 506 to operate. Terminal 702 is at VHV.

Figure 8:
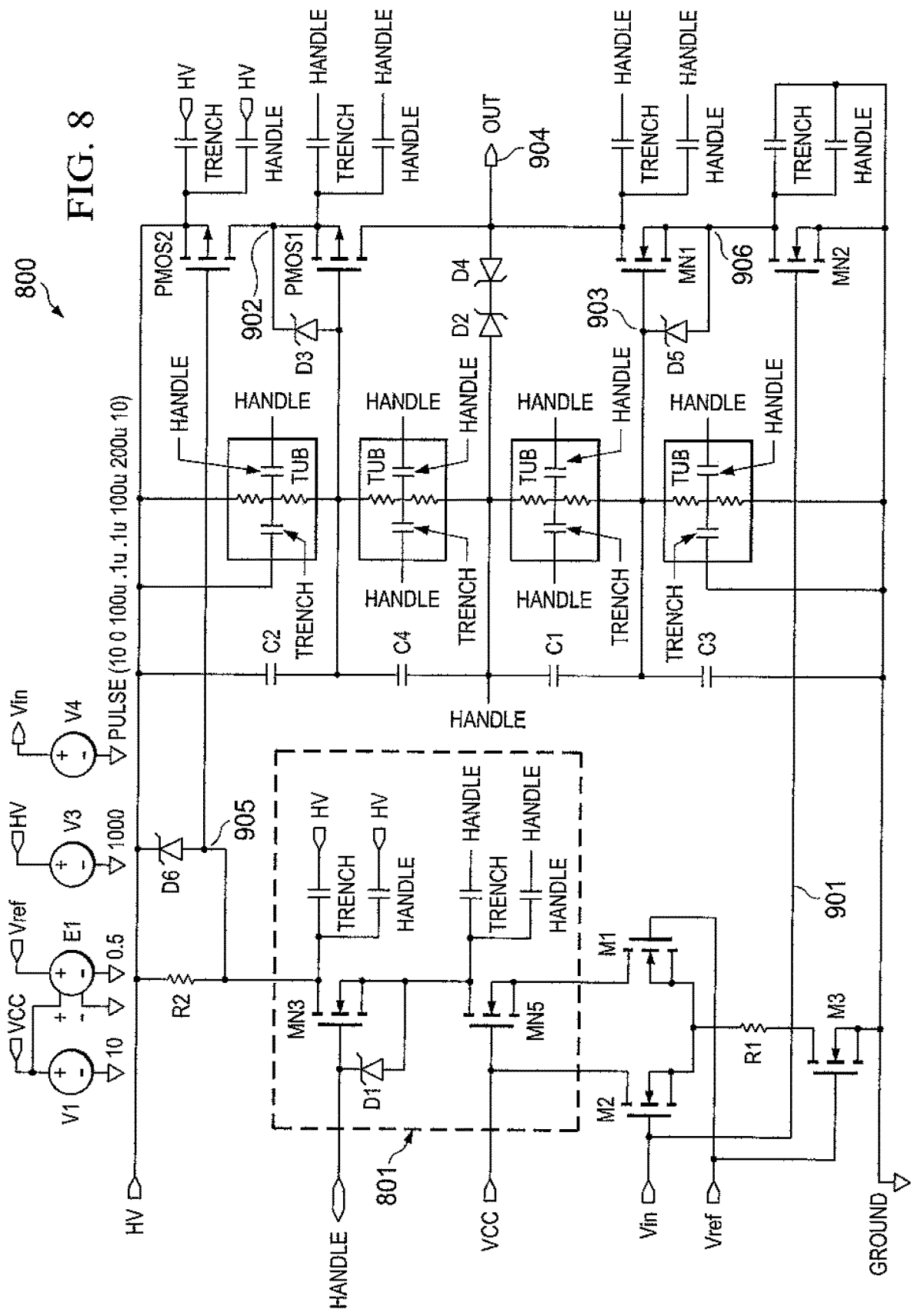
FIG. 8 is a circuit diagram of an application that implements the invention.
Figure 9A:
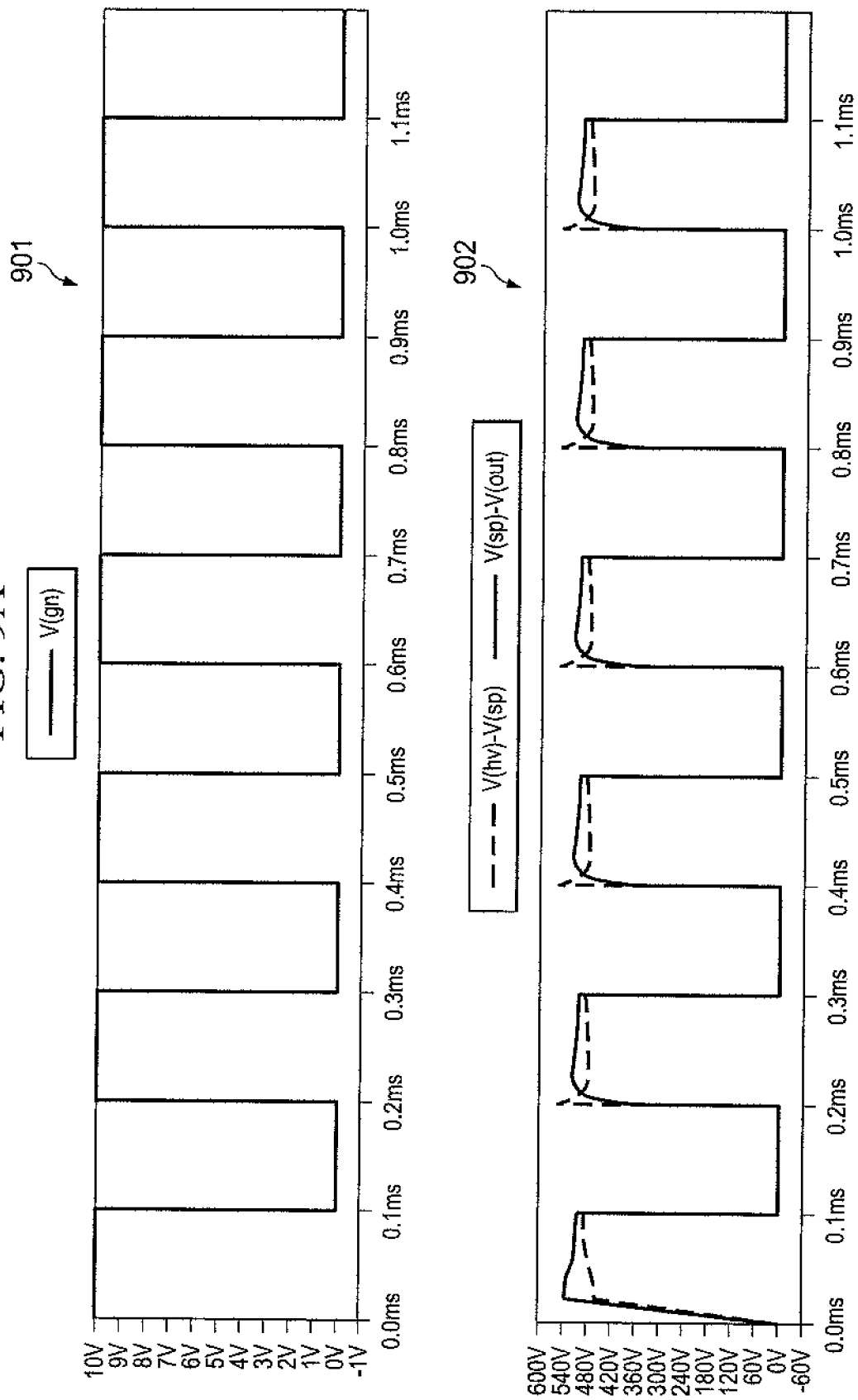
FIG. 9A is a graph illustrating the various outputs of the circuit of FIG. 8.
Figure 9B:
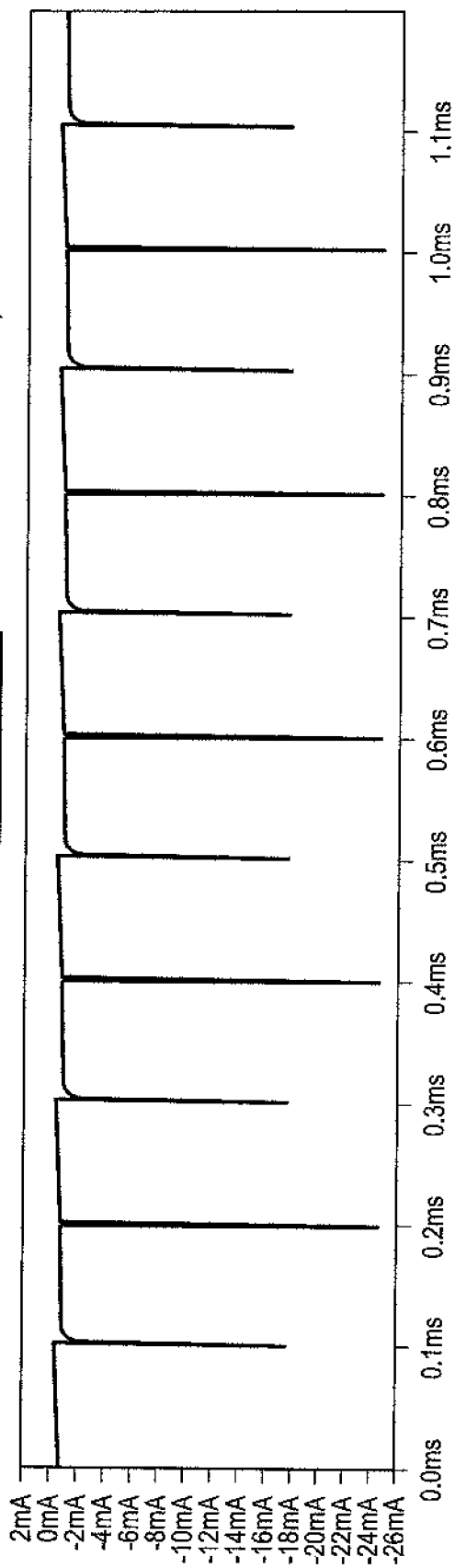
FIG. 9B is a graph illustrating the various outputs of the circuit of FIG. 8.
Figure 9B:
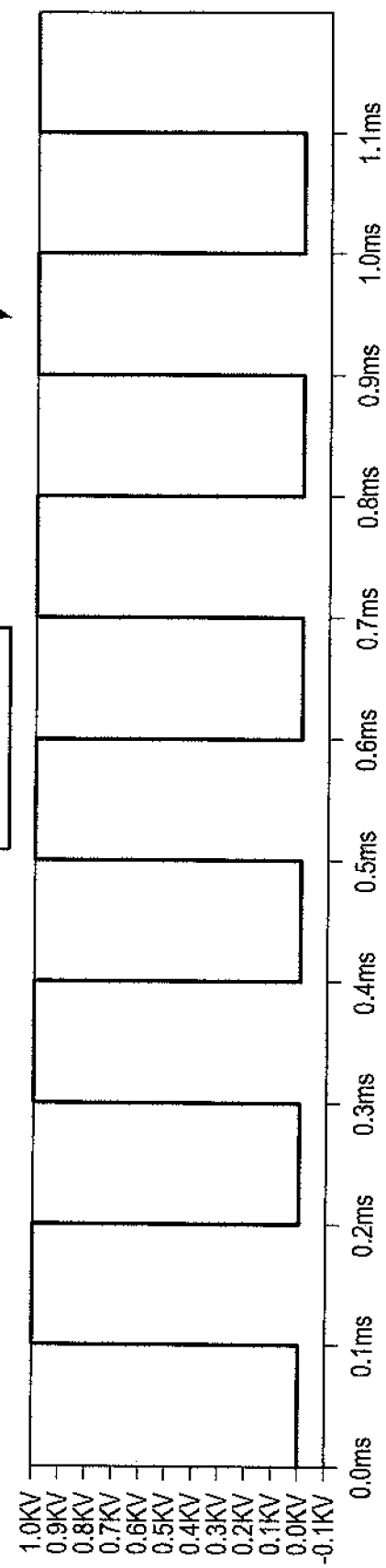
Figure 9C:
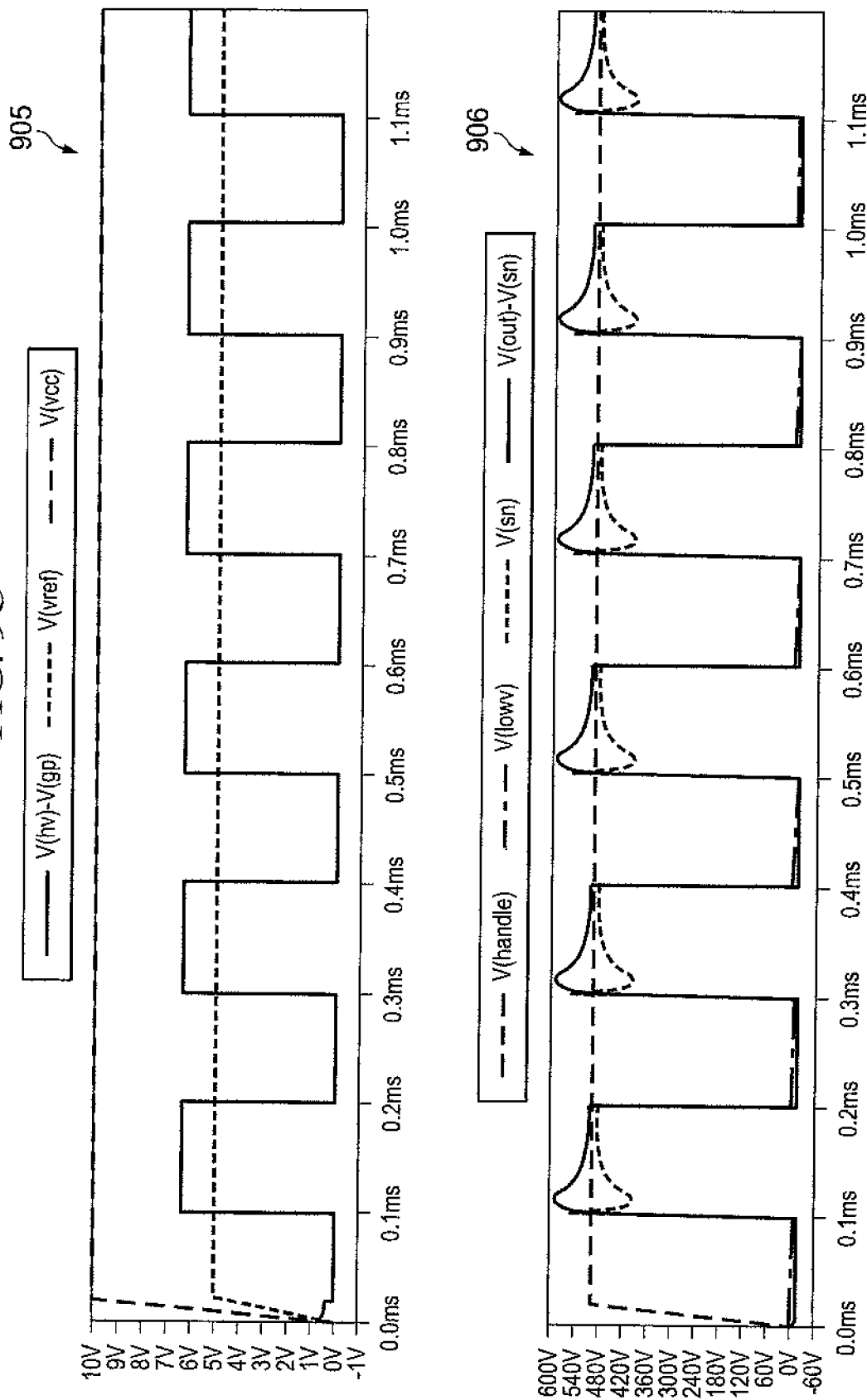
FIG. 9C is a graph illustrating the various outputs of the circuit of FIG. 8.

The invention can be implemented in voltage dividers, level shifters, IGBT gate drivers and more complex functions and integrated circuits. FIG. 8 illustrates the invention 801 as part of a level shifter 800. FIGS. 9A, 9B and 9C are plots illustrating the voltage levels at nodes and terminals of FIG. 8. More specifically:

Plot 901 of FIG. 9A corresponds to the voltage at 901 of FIG. 8. Voltage 901 shown as V(gn) on FIG. 901 is the input voltage shown to vary from 0 to 10V in this embodiment.

Plot 902 of FIG. 9A corresponds to the voltages across PMOS1 and PMOS2 of FIG. 8. These transistors should not and do not exceed 560V Plot 903 of FIG. 9B shows the HV supply current of FIG. 8 during switching.

Plot 904 of FIG. 9B corresponds to the voltage at 904 of FIG. 8. This is the result of the inverting level shifter showing output voltage swinging from 1000V to 0V when the input voltage goes from 0 to 10V.

Plot 905 of FIG. 9C corresponds to the voltage at 905 minus Voltage at HV of FIG. 8 and is labeled V(hv)−(V(gp). Plot 905 shows V(Vcc) and V(vref) from FIG. 8. These show the onset of the power supply voltages (Vcc) and V(vref) which are externally applied as well as the effective gate voltage of PMOS2.

Plot 906 of FIG. 9C corresponds to the voltage at 906 of FIG. 8 shown as V(sn) in Plot 906. The handle voltage V(handle) is also shown, as expected this handle voltage is set at HV/2 by the circuit. V(sn) and V(out−Vsn) are the drain to source voltages of the two nmos transistors NMOS1 and NMOS2 which should not and do not exceed 625V.

A further embodiment of the invention is a voltage divider capable of reliably handling up to 1000 volts from commercial 650 volt NMOS/560 volt PMOS CMOS technology. A further embodiment is an IGBT gate driver operating at up to 1,000 volts from commercial 650 volt NMOS/560 volt PMOS CMOS technology. One skilled in the art would recognize that the invention allows the design of higher voltage ICs than the basic technology would conventionally allow.

Figure 10:
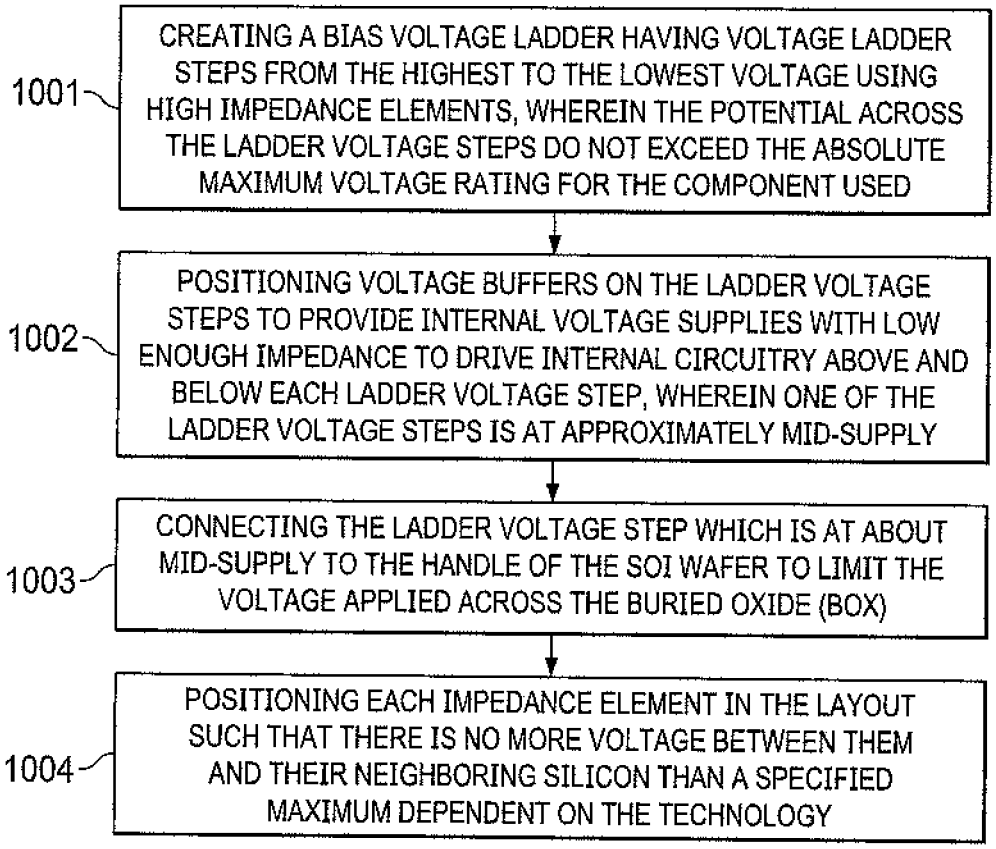
FIG. 10 is a flow chart of a method of fabricating the invention.

FIG. 10 provides a flow chart 1001 of an embodiment of the method of the invention as follows:

Step 1001: Create a bias voltage ladder from the highest to the lowest voltage using high impedance elements, ensuring that the voltage ladder steps do not exceed the absolute maximum for the component to be used. Ladder voltages are determined from the components required for the design.

Step 1002: Position voltage buffers on these voltage ladder steps to provide internal voltage supplies with a sufficiently low impedance to drive the internal circuitry above and below each voltage ladder step.

Step 1003: Ensure that one of the voltage ladder steps is about mid-supply and connect it to the handle wafer. The handle wafer is the silicon substrate over which the buried oxide and thinner top silicon layer of Silicon-On-Insulator (SOI) wafers are attached. This voltage step should not exceed the buried oxide (BOX) reliable rated voltage for reliability which is lower than the BOX breakdown voltage.

Step 1004: Position each impedance element in the layout such that the voltage between each such component and its neighboring silicon is lower than the specified maximum for the technology. This may require placement of impedance elements in a tub which is biased at an intermediate potential extracted from the voltage ladder initially created in steps (a) and (b). In an aspect, the impedance elements are resistors, capacitors or inductors or any combinations or permutations thereof. Using the method of the invention, one can fabricate smaller IC's capable of operating at higher voltages.

Aspects of the invention can be modified to increase or vary the voltage handling capabilities across elements, components, islands, tubs and/or handles. For example, the invention can be modified or extended by the use of multiple trenches. Laterally, the maximum voltage attainable is limited only by the trenches. Each trench has an intrinsic voltage, handling capability that can be multiplied to handle larger voltages. For example, if a single trench can handle 500 volts, then three (3) trenches separated by a small amount of silicon can handle up to 1500 volts (3×500 volts). Hence, laterally there is no theoretical limit to the maximum voltage which the invention can handle, it being practically limited only by the number of trenches used. Further, the thickness of the buried oxide (BOX) dictates the maximum voltage which the IC can handle. Thus, by increasing the thickness of the buried oxide (BOX), one can increase the voltage handling capability of the invention. Also, alternate configurations of the invention comprise placing one tub within another tub in a so-called tub-in-tub configuration wherein a high-voltage circuit is fabricated by inserting tubs biased at V2 into tubs biased at V1 such that trench (single or multiple) isolation provides |V1−V2|.

The embodiments shown and described above are only exemplary. Even though numerous characteristics and advantages of the present invention have been set forth in the foregoing description together with details of the circuits and methods of the present invention, the disclosure is illustrative only and changes may be made within the principles of the invention to the full extent indicated by the broad general meaning of the terms used herein. Various alterations, modifications and substitutions can be made to the circuits and methods of the disclosed invention and the fabrication system that implements the present invention without departing in any way from the spirit and scope of the invention. Hence, the invention includes any permutations of types of impedance devices, tub-in-tub configurations, number of trenches and buried oxide thickness.

We claim as follows:

1. An integrated circuit (IC), comprising,
   four (4) impedance elements coupled in series;
   a first terminal of the first impedance element configured to be coupled to a very high voltage (VHV) and a second terminal of the first impedance element coupled to a first terminal of the second impedance element;
   the second terminal of the first impedance element and the first terminal of the second impedance element coupled to a first tub at VHV multiplied by ¾;
   the second terminal of the third impedance element and the first terminal of the fourth impedance element coupled to a second tub at VHV multiplied by ¼; and
   the second terminal of the second impedance element and the first terminal of the third impedance element coupled to bias a handle and a third surrounding tub at approximately VHV multiplied by ½.

2. The IC of claim 1, wherein each impedance element is at least a resistor.

3. The IC of claim 1, wherein each impedance element is a device selected from any combination of resistors, capacitors and inductors.

4. An integrated circuit (IC), comprising,
   four (4) cascoded resistors coupled in series, each resistor having a value of 7.5 MegOhm;
   a first terminal of the first resistor configured to be coupled to a VHV and a second terminal of the first resistor coupled to a first terminal of the second resistor;
   the second terminal of the first resistor and the first terminal of the second resistor coupled to a first tub at a specified very high voltage (VHV) multiplied by ¾;
   the second terminal of the third resistor and the first terminal of the fourth resistor coupled to a second tub at a specified very high voltage (VHV) multiplied by ¼; and
   the second terminal of the second resistor and the first terminal of the third resistor coupled to bias a handle and surrounding tub at approximately VHV multiplied by ½.

5. The integrated circuit of claim 4, wherein each of the four (4) cascoded series resistors are rated to have a potential across the terminals thereof of 320 Volts.

6. The integrated circuit of claim 4, wherein the resistors are configured to bias one tub at +320 volt maximum and the other tub at −320 volt maximum.

7. An integrated circuit (IC) fabricated on a Silicon-On-Insulator (SOI) wafer, comprising,
   a plurality of impedance elements cascoded in series, each impedance element having a specified value;
   a subset of the impedance elements arranged to bias a first tub at a specified very high voltage (VHV) multiplied by a first predetermined ratio;
   a second subset of the impedance elements further arranged to bias a second tub at VHV multiplied by a second predetermined ratio; and
   each of the impedance elements further arranged to bias a handle and a third surrounding tub at VHV multiplied by a third predetermined ratio.

8. The IC of claim 7, wherein each impedance element is selected from any combination of resistors, capacitors and inductors.

9. The IC of claim 7, wherein each impedance element is a resistor.

10. The IC of claim 9, wherein each of the cascoded resistors have substantially the same resistance value.

11. The IC of claim 9, wherein each of the cascoded series resistors have different resistance values.

12. The IC of claim 7 wherein any of the first tub, second tub or surrounding third tub is situated inside a fourth tub.

13. The IC of claim 7 wherein each of the first tub and second tub is situated inside a respective fourth tub and fifth tub.

14. A method of fabricating an integrated circuit on a Silicon-On-Insulator (SOI) wafer and capable of operating reliably at a very high voltage, comprising the steps of:
  (a) creating a bias voltage ladder having voltage ladder steps from the highest to the lowest voltage using high impedance elements, wherein the potential across the ladder voltage steps do not exceed the absolute maximum voltage rating for the component used;
  (b) positioning voltage buffers on the ladder voltage steps to provide internal voltage supplies with low enough impedance to drive internal circuitry above and below each ladder voltage step, wherein one of the ladder voltage steps is at approximately mid-supply;
  (c) connecting the ladder voltage step which is at about mid-supply to the handle of the SOI wafer to limit the voltage applied across the buried oxide (BOX); and
  (d) positioning each impedance element in the layout such that there is no more voltage between them and their neighboring silicon than a specified maximum dependent on the technology.

15. The method of claim 14, wherein the impedance elements are resistors.

16. The method of claim 14, wherein the impedance elements are any combination of resistors, capacitors and inductors.

17. The method of claim 14, wherein the ladder voltages are determined from the ratings of the impedance elements required for the design.

18. The method of claim 14, wherein the handle is a silicon substrate over which the buried oxide (BOX) and thinner top silicon layer are deposited.

19. The method of claim 14, wherein each ladder voltage step does not exceed the buried oxide (BOX) breakdown voltage.

20. The method of claim 14, wherein each impedance element is placed in one of a first tub or a second tub, each of which is biased at an intermediate potential extracted from the voltage ladder steps initially created in steps (a) and (b) of claim 14.

* * * * *